US007259629B2

United States Patent
Redman-White et al.

(10) Patent No.: US 7,259,629 B2
(45) Date of Patent: Aug. 21, 2007

(54) VARIABLE GAIN AMPLIFIER WITH IMPROVED CONTROL CHARACTERISTICS LINEARITY

(75) Inventors: William Redman-White, Medstead (GB); Sudhir Aggarwal, Fremont, CA (US)

(73) Assignee: NXP, B.V., Eindhoven (NL)

( * ) Notice: Subject to any disclaimer, the term of this patent is extended or adjusted under 35 U.S.C. 154(b) by 73 days.

(21) Appl. No.: 10/524,182

(22) PCT Filed: Aug. 8, 2003

(86) PCT No.: PCT/IB03/03512

§ 371 (c)(1),
(2), (4) Date: Feb. 10, 2005

(87) PCT Pub. No.: WO2004/015859

PCT Pub. Date: Feb. 19, 2004

(65) Prior Publication Data

US 2005/0242881 A1    Nov. 3, 2005

(30) Foreign Application Priority Data

Aug. 12, 2002   (US) .................... 60/403,293
Mar. 19, 2003   (US) .................... 60/455,941

(51) Int. Cl.
*H03G 3/30*      (2006.01)

(52) U.S. Cl. .................................................. 330/284
(58) Field of Classification Search ................ 330/281, 330/284–285, 144–145
See application file for complete search history.

(56) References Cited

U.S. PATENT DOCUMENTS

| 5,999,056 A | 12/1999 | Fong |
| 6,211,737 B1 | 4/2001 | Fong |
| 6,281,754 B1 | 8/2001 | Mizunaga |
| 6,351,188 B1 * | 2/2002 | Masahiro .................... 330/284 |

FOREIGN PATENT DOCUMENTS

| EP | 1 071 204 A2 | 1/2001 |
| EP | 1 093 222 A1 | 4/2001 |

* cited by examiner

*Primary Examiner*—Robert Pascal
*Assistant Examiner*—Hieu Nguyen
(74) *Attorney, Agent, or Firm*—Peter Zawilski

(57) ABSTRACT

A variable-impedance device is placed in parallel with the input to a variable-gain amplifier, and is controlled so as to provide a substantially constant load impedance to a source. Preferably, the variable-impedance device includes a diode with a variable bias current. This diode bias current is adjusted inversely with the amplifier bias current, such that the parallel sum of the two input path impedances remains approximately constant across a wide range of gain. This variable gain amplifier system is particularly well suited for use in a wireless transmitter, or cellular telephone.

17 Claims, 1 Drawing Sheet

200

VARIABLE GAIN AMPLIFIER WITH IMPROVED CONTROL CHARACTERISTICS LINEARITY

This invention relates to the field of electronics, and in particular to a variable gain amplifier that has consistent control characteristics linearity across a wide range of gain.

Variable gain amplifiers are commonly used, particularly in cellular telephone handset transmitters. Common emitter gain stages are typically used to minimize power consumption, wherein the gain is adjusted by adjusting the bias current. Unfortunately, the input impedance of a common emitter amplifier varies with the bias current, leading to a loss of gain and/or efficiency when the variable gain amplifier is driven by a constant-impedance source. At high levels of bias current, the loading on the constant-impedance source is substantial, and predictable/reliable performance is difficult to achieve.

Common solutions to this variable-input-impedance problem include the use of a low-impedance device in parallel with the input to the variable-gain amplifier. This solution substantially reduces the range of variation of the effective input impedance seen by the constant-impedance source, but also results in an even greater loading of the source at high levels of bias current, and hence a loss of available gain in the system. A stepped gain control amplifier may also be used, but such an approach requires the added complexity of a control loop to control the gain.

It is an object of this invention to provide a variable gain amplifier having consistent and predictable performance across a wide range of gain. It is a further object of this invention to provide a variable gain amplifier having substantially constant input impedance across a wide range of gain.

These objects and others are achieved by providing a variable-impedance device in parallel with the input to a variable-gain amplifier, and controlling the variable-impedance device so as to provide a substantially constant load impedance to a source. Preferably, the variable-impedance device includes a diode with a variable bias current. This diode bias current is adjusted inversely with the amplifier bias current, such that the parallel sum of the two input path impedances remains approximately constant across a wide range of gain.

This variable gain amplifier system is particularly well suited for use in a wireless transmitter, or cellular telephone.

Throughout the drawings, the same reference numeral refers to the same element, or an element that performs substantially the same function.

Figure 1:
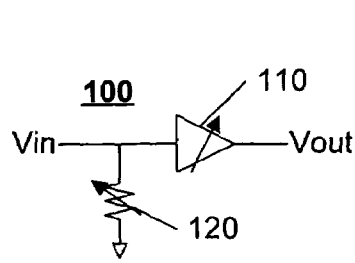
FIG. 1 illustrates an example block diagram of a variable gain amplifier system in accordance with this invention.

FIG. 1 illustrates an example block diagram of a variable gain amplifier system 100 in accordance with this invention. The amplifier system 100 includes a conventional variable gain amplifier 110 and a variable impedance device 120. In accordance with this invention, the variable impedance device 120 is configured to provide an impedance that varies inversely to the variation in the input impedance of the variable gain amplifier 110 as the gain in varied. In a preferred embodiment, the variable input impedance device 120 is controlled so that the effective input impedance at the input node Vin, being the parallel combination of the impedances of the variable gain amplifier 110 and the variable impedance device 120, remains substantially constant as the gain is varied.

Figure 2:
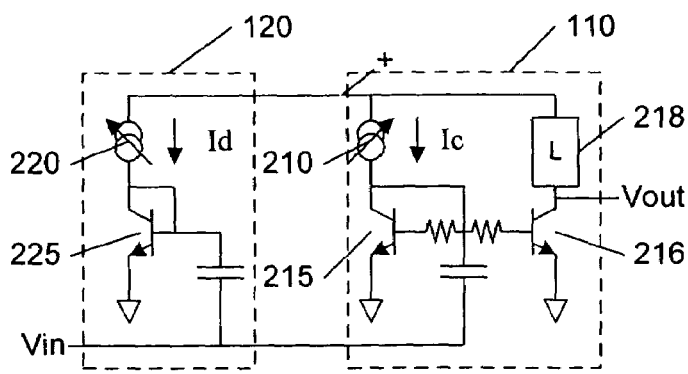
FIG. 2 illustrates an example circuit diagram of a variable gain amplifier system in accordance with this invention.

FIG. 2 illustrates an example circuit diagram of a variable gain amplifier system in accordance with this invention, wherein the variable gain amplifier 110 and the variable input device 120 are each capacitively coupled to the input Vin. The variable gain amplifier 110 is illustrated as a conventional common-emitter amplifier, wherein the transistors 215 and 216 are configured as a current mirror, and the collector bias current Ic determines where on the characteristics curve the transistor 216 operates. The current through the load 218 is determined by the bias current and the variation about this current based on the gain of the amplifier 110 applied to the input Vin. At a low level of bias current Ic, the slope of the characteristics curve is slight, and thus the gain is low; at higher levels of bias current, the slope is steeper, thereby providing greater gain. The variable current source 210 controls the bias current Ic, and thus serves as a gain control.

The variable impedance device 120 is illustrated in FIG. 2 as a diode-configured transistor 225 with a variable current source 220 that determines the diode bias current Id. In accordance with this invention, the diode bias current Id is adjusted to provide an impedance of the device 120 that varies inversely with the input impedance of the variable amplifier 110 as the gain is changed. In the example of FIG. 2, the diode current Id is decreased as the amplifier current Ic is increased, thereby providing increased impedance as the input impedance of the amplifier 110 decreases, and decreased impedance as the input impedance of the amplifier 110 increases. Preferably, the device 120, being operated in parallel with the input of the amplifier 110, is configured to provide an impedance that varies with the gain of the amplifier 110 such that the parallel input impedance at the node Vin remains substantially constant.

In the example of FIG. 2, the desired diode bias current Id is determined as follows.

As noted above, the highest input conductance (lowest input impedance) occurs at maximum gain, at a maximum amplifier bias current $Ic_{max}$. Using the conventional small signal model for a common emitter amplifier, the effective input conductance $G_{amp}$ of the amplifier 110 is given as:

$$G_{amp} = \frac{q * Ic_{max}}{\beta kT}. \qquad (1)$$

The effective input conductance $G_{in}$ of the parallel combination of the amplifier 110 and device 120 is preferably just slightly larger than this highest input conductance of the amplifier 110. In this manner the overall loading of the prior stage is just slightly larger than the conventional amplifier 110 alone. Expressed algebraically:

$$G_{in} = M * \frac{q * Ic_{max}}{\beta kT}, \quad (2)$$

where M is nominally a factor of 1.1 or so.

Using the conventional small signal model for a diode-configured transistor, the overall input conductance can be expressed as:

$$G_{in} = M * \frac{q * Ic_{max}}{\beta kT} = \frac{q * Ic}{\beta kT} + \frac{q * Id}{kT}. \quad (3)$$

and, solving for the diode bias current Id directly:

$$Id = \frac{M * Ic_{max} - Ic}{\beta}. \quad (4)$$

Figure 3:
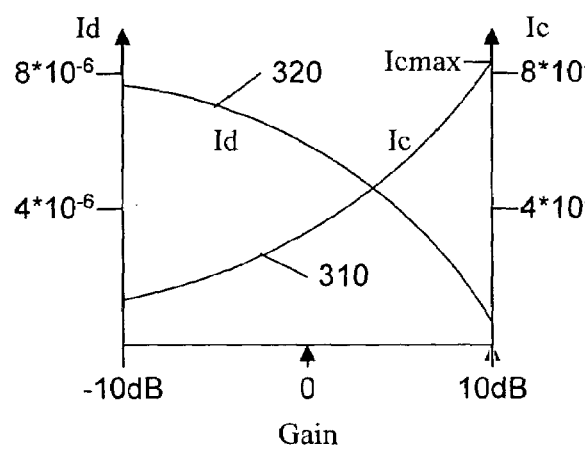
FIG. 3 illustrates an example plot of the relationship between the diode bias current and the amplifier bias current across a wide range of gain in accordance with this invention.

FIG. 3 illustrates an example plot of the relationship between the diode bias current Id and the amplifier bias current Ic across a wide range of gain in accordance with this invention. The curve 310 illustrates the conventional relationship between the amplifier bias current Ic and the resultant gain of the amplifier 110 of FIG. 2. The curve 320 illustrates the desired diode bias current Id as the amplifier bias current Ic is varied, corresponding to equation 4, above, wherein $\beta$ accounts for the difference in scale of the vertical axes for Id and Ic.

Figure 4:
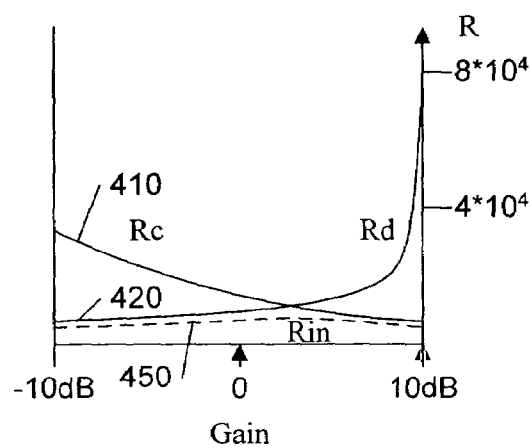
FIG. 4 illustrates an example plot of the resultant diode input impedance, amplifier input impedance, and overall input impedance across a wide range of gain in accordance with this invention.

FIG. 4 illustrates an example plot of the resultant diode input impedance Rd, amplifier input impedance Rc, and overall input impedance Rin across a wide range of gain. As can be seen, in accordance with this invention, the overall input impedance Rin is substantially constant across the range of gain, compared to the input impedance Rc of a conventional variable gain amplifier alone.

With specific regard to the examples above, Rin corresponds to the inverse of the conductance Gin of equations 2 and 3, and is shown slightly curved for illustrative purposes. If the devices correspond exactly to the conventional small signal models given above, and the diode current Id is controlled exactly as defined in equation 4, the resultant Rin will be flat across the entire range of gain for which the small signal models hold.

Figure 5:
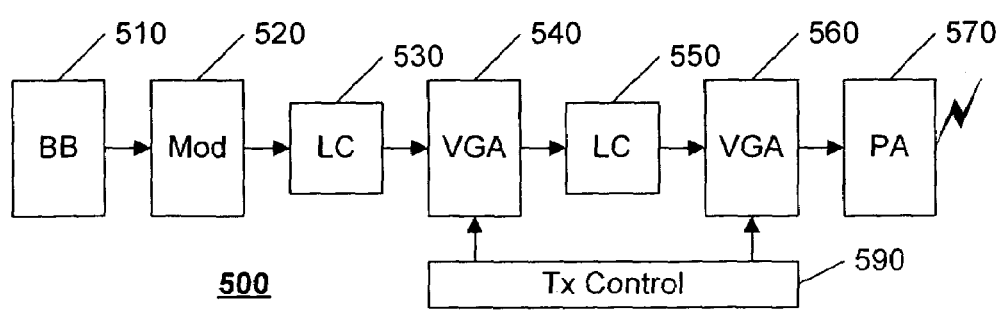
FIG. 5 illustrates an example transmitter with variable gain amplifiers in accordance with this invention.

FIG. 5 illustrates an example transmitter 500 with variable gain amplifiers 540, 560 in accordance with this invention. The output of a baseband processing device 510 is coupled to a modulator 520 that provides a modulated signal at a desired radio-frequency (RF). This RF signal is filtered at 530, typically via an L-C tank circuit, and subsequently amplified by a variable gain amplifier 540. As is known in the art, the performance of a filter, and particularly an L-C tank circuit, is particularly sensitive to loading, and will exhibit varying performance when presented with a varying load. In accordance with this invention, the variable-gain amplifier 540 includes a variable impedance device at its input in parallel with an amplifier stage that is configured to provide a substantially constant impedance load to the filter 530 regardless of the desired gain.

The output of the variable-gain amplifier 540 is again filtered by a filter device 550, typically also an L-C tank circuit, and subsequently amplified by a variable gain amplifier 560. As discussed above, to avoid varying performance of the filter 550, the variable gain amplifier 560 includes a variable impedance device that is configured to provide a substantially constant impedance load to the filter 550 regardless of the desired gain.

A controller 590 controls the gain of the amplifier stage and the impedance of the variable impedance device of each of the amplifiers 540, 560, using, for example, the equations given above to adjust the amplifier and diode bias currents Ic and Id to achieve the desired gain while maintaining a constant input impedance. In a cellular telephone embodiment, for example, the controller 590 adjusts the gain of the amplifiers 540, 560 in dependence upon the current cellular cell size and/or the current interference or other noise factors. The output of the second variable gain amplifier 560 is coupled to an RF power amplifier 570 for transmission as a radio frequency wave at the desired power level, determined by the gain of the variable gain amplifiers 540, 560.

As would be evident to one of ordinary skill in the art, the gain and impedance control functions may be distributed between the controller 590 and the amplifiers 540, 560. The controller 590 may be configured to merely provide a gain control signal to the amplifiers 540, 560, and the amplifiers 540, 560 would be configured to provide the appropriate bias currents to the amplifier and diode; at another extreme, the controller 590 may be configured to provide the amplifier and diode bias currents Ic and Id directly to each of the amplifiers 540, 560.

The foregoing merely illustrates the principles of the invention. It will thus be appreciated that those skilled in the art will be able to devise various arrangements which, although not explicitly described or shown herein, embody the principles of the invention and are thus within its spirit and scope. For example, other techniques and configurations are commonly available for providing a variable gain amplifier 110, which may exhibit different variances in input impedance with gain. One of ordinary skill in the art will recognize that other techniques and configurations for providing a variable impedance device 120 may be used to provide the inverse impedance characteristics of these other amplifiers 110 to effect a relatively constant parallel input impedance with varying gains. These and other system configuration and optimization features will be evident to one of ordinary skill in the art in view of this disclosure, and are included within the scope of the following claims.

The invention claimed is:

1. An amplifier system having a gain that is variable, comprising:
   a variable gain amplifier that provides the gain, having an input impedance that varies with the gain, and
   a variable impedance device, including a first transistor configured as a diode, the variable impedance device operably coupled in parallel with the input impedance of the variable gain amplifier,
   wherein
   the variable impedance device is configured to provide an impedance that varies in opposition to the input impedance of the variable gain amplifier as the gain is varied.

2. The amplifier system of claim 1, wherein
   the variable gain amplifier includes a common emitter amplifier, and
   the gain is varied by varying a bias current of the common emitter amplifier.

3. The amplifier system of claim 2, wherein
   the variable gain amplifier includes:
   a second transistor and third transistor that are configured as a current mirror, and a variable current source that is configured to provide the bias current to the current mirror.

4. The amplifier system of claim 3, wherein
the variable impedance device includes an other variable current source that is configured to provide a diode bias current for biasing the first transistor, and
the impedance of the variable impedance device is based on the diode bias current.

5. The amplifier system of claim 4, wherein
the diode bias current, Id, substantially corresponds to:

$$Id = \frac{M * Ic_{\max} - Ic}{\beta};$$

and
M is a constant between 1.0 and 2.0,
$Ic_{max}$ is a maximum value of the bias current, Ic, of the variable gain amplifier, at a peak value of the gain.

6. The amplifier system of claim 1, wherein
the variable gain amplifier includes a common emitter amplifier, and
the gain is varied by varying a bias current of the common emitter amplifier.

7. The amplifier system of claim 1, wherein
the variable gain amplifier includes:
transistors tat are configured as a current mirror, and
a variable current source that is configured to provide the bias current to the current mirror.

8. The amplifier system of claim 1, wherein
the variable impedance device includes a variable current source that is configured to provide a bias current that controls the impedance of the variable impedance device.

9. A transmitter having a power output that is variable, comprising:
one or more variable gain amplifiers that provide a variable gain of an input signal to provide the variable power output,
each of the variable gain amplifiers including
an amplifier state that provides a current that is variable, having an input impedance that varies with the gain, and
a variable impedance device, operably coupled in parallel with the input impedance of the amplifier stage, at least one of the variable impedance devices includes a first transistor that is configured as a diode; and
wherein
the variable impedance device is configured to provide an impedance tat varies in opposition to the input impedance of the amplifier stage as the gain is varied.

10. The transmitter of claim 9, wherein
at least one of the amplifier stages includes a common emitter amplifier, and
the gain is varied by varying a bias current of the common emitter amplifier.

11. The transmitter of claim 10, wherein
at least one of the amplifier stages further includes:
a second transistor and third transistor that are configured as a current mirror, and
a variable current source that is configured to provide the bias current to the current mirror.

12. The transmitter of claim 11, wherein
the at least one of the variable impedance devices includes an other variable current source that is configured to provide a diode bias current for biasing the first transistor, and
the impedance of the at least one of the variable impedance devices is based on the diode bias current.

13. The transmitter of claim 12, wherein
the diode bias current, Id, substantially corresponds to:

$$Id = \frac{M * Ic_{\max} - Ic}{\beta};$$

and
β is a gain factor of the third transistor,
M is a constant between 1.0 and 2.0,
$Ic_{max}$ is a maximum value of the bias current, Ic, of the variable gain amplifier, at a peak value of the gain.

14. The transmitter of claim 9, wherein
at least one of the amplifier stages includes a common emitter amplifier, and
the gain is varied by varying a bias current of the common emitter amplifier.

15. The transmitter of claim 9, wherein
at least one of the amplifier stages includes:
transistors that are configured as a current mirror, and
a variable current source that is configured to provide a bias current to the current mirror, the gain being dependent upon the bias current.

16. The transmitter of claim 9, wherein
at least one of the variable impedance devices includes a variable current source that is configured to provide a bias current that controls the impedance of the variable impedance device.

17. The transmitter of claim 9, wherein
at least one of the variable gain amplifiers is driven by an L-C tuned circuit.

* * * * *